United States Patent [19]

Prilik

[11] Patent Number: 4,686,462

[45] Date of Patent: Aug. 11, 1987

[54] FAST RECOVERY POWER SUPPLY

[75] Inventor: Ronald J. Prilik, South Burlington, Vt.

[73] Assignee: International Business Machines Corporation, Armonk, N.Y.

[21] Appl. No.: 780,533

[22] Filed: Sep. 26, 1985

[51] Int. Cl.$^4$ .................. G01R 15/12; G06G 7/12; H03K 5/153

[52] U.S. Cl. .................. 324/158 R; 324/73 R; 307/494; 307/362

[58] Field of Search ............ 324/73 R, 158 R, 158 T, 324/73 PC; 330/86, 282; 307/359, 362, 494

[56] References Cited

U.S. PATENT DOCUMENTS

| | | | |
|---|---|---|---|
| 3,761,695 | 9/1973 | Eichelberger | 235/153 AC |
| 4,085,340 | 4/1978 | Salesky et al. | 307/237 |
| 4,441,075 | 4/1984 | McMahon | 324/73 R |
| 4,441,080 | 4/1984 | Saari | 330/86 |

OTHER PUBLICATIONS

F. Bayer; 37 A Digital Gain Measuring Set"; Funk-schaw Journal, No. 25, vol. 49; 12/02/1977; pp. 1209–1214.

Primary Examiner—Reinhard J. Eisenzopf
Assistant Examiner—Vinh P. Nguyen
Attorney, Agent, or Firm—Francis J. Thornton

[57] ABSTRACT

A tester for logic circuits provided with a fast recovery power supply for supplying high current to a logic circuit under test and for measuring a low current of the circuit under test. The power supply of the tester has first and second amplifiers coupled to the CMOS circuit being tested and having dual feedback loops with one loop controlling the resistance of the other loop. The first amplifier is coupled between a reference voltage and a capacitor supplying current to the CMOS circuit under test. The second amplifier is coupled between the same reference voltage, and the output of the first amplifier. A resistive feedback is coupled between the circuit under test and the output of the first amplifier and an AC coupled impedance switching means is coupled between the output of the second amplifier and across the resistive feedback whereby the impedance switch can alter the impedance of the resistive feedback by shunting the resistor to recharge the capacitor supplying current to the circuit under test.

5 Claims, 6 Drawing Figures

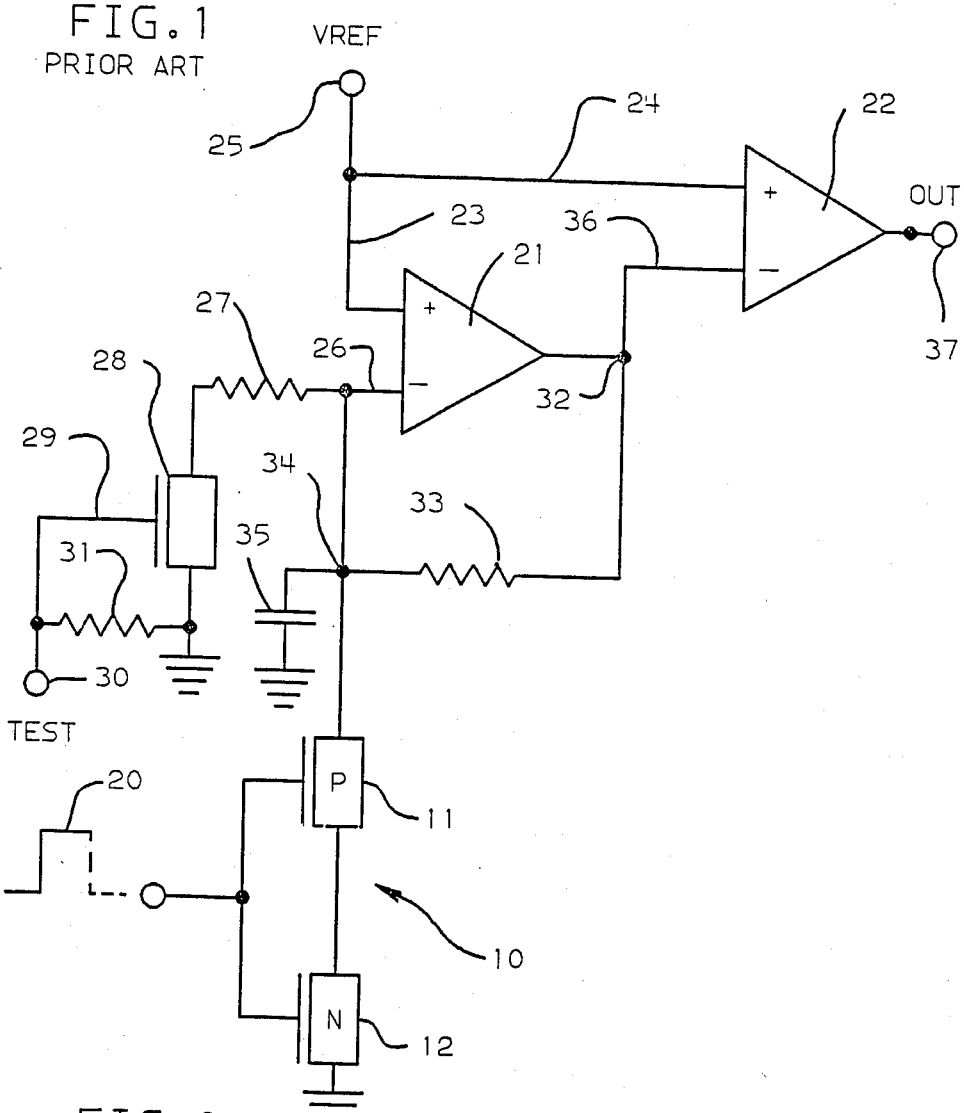
FIG. 1 PRIOR ART
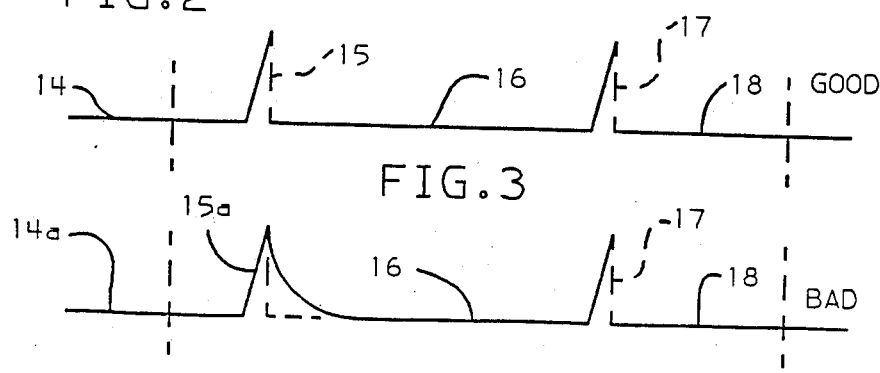
FIG. 2
FIG. 3

FAST RECOVERY POWER SUPPLY

BACKGROUND OF THE INVENTION

1. Field Of The Invention

The invention relates generally to semiconductor logic test systems especially those logic test systems used to test for shorts in complementary metal oxide semiconductor (CMOS) transistor circuits and more particularly, to a fast recovery power supply for supplying a high current to a CMOS device under test and for measuring the low current of the device while it is under test.

2. Description of the Prior Art

Microprocessors employ large numbers of logic circuits. To test such microprocessors a technique known as Level Sensitive Scan Device (LSSD) testing was developed. This technique has been described, for example in U.S. Pat. No. 3,761,695; U.S. Pat. No. 4,441,075; Electronics Mar. 10, 1983, pgs. 110–115; and Electronics Mar. 15, 1979, pgs. 10–11.

This LSSD testing is satisfactory to measure for all defects in CMOS transistor circuits except for a defect which represents a unique failure mechanism known as the shorted fault. Such shorted faults are usually but not always source to drain shorts.

The present apparatus is particularly designed to test for such shorted faults.

SUMMARY OF THE PRESENT INVENTION

The present invention was devised to overcome this lack in present state of the art LSSD testers and basically is directed to a tester for logic circuits that is provided with a fast recovery power supply capable of supplying high current to a complementary transistor logic circuit under test and for measuring a low current of the circuit under test after test pulses are applied.

In the present invention the power supply of the tester is comprised of first and second amplifiers coupled to the circuit being tested and having dual feedback loops with one loop controlling the resistance of the other loop. The first amplifier is coupled between a reference voltage and a capacitor supplying current to the complementary transistor logic circuit under test. The second amplifier is coupled between the same reference voltage, and the output of the first amplifier. Resistive feedback means are coupled between the circuit under test and the output of the first amplifier and an AC coupled impedance switching means is coupled between the output of the second amplifier and across the resistive feedback means whereby the impedance switching means can alter the impedance of the resistive feedback means by shunting the resistor to recharge the capacitor supplying current to the circuit under test.

This invention permits dynamic capture of a voltage level proportioned to a particular level of (current) interest and provides a fast response bias voltage to a circuit under test.

The invention further can be used for shorted fault testing of CMOS device circuits.

The invention and its objects and advantages will become apparent from the detailed description of the preferred embodiment below.

BRIEF DESCRIPTION OF THE DRAWINGS

FIG. 1 illustrates in schematic form the CMOS current monitor test configuration of the prior art.

FIG. 2. illustrates the expected current pulse pattern to be obtained whenever a CMOS circuit is tested and both devices are without source to drain faults.

FIG. 3 illustrates both the output pattern when a CMOS circuit is tested and one of the devices therein is in a shorted condition and tested using the circuit of FIG. 1.

DESCRIPTION OF THE PREFERRED EMBODIMENT

Figure 4:
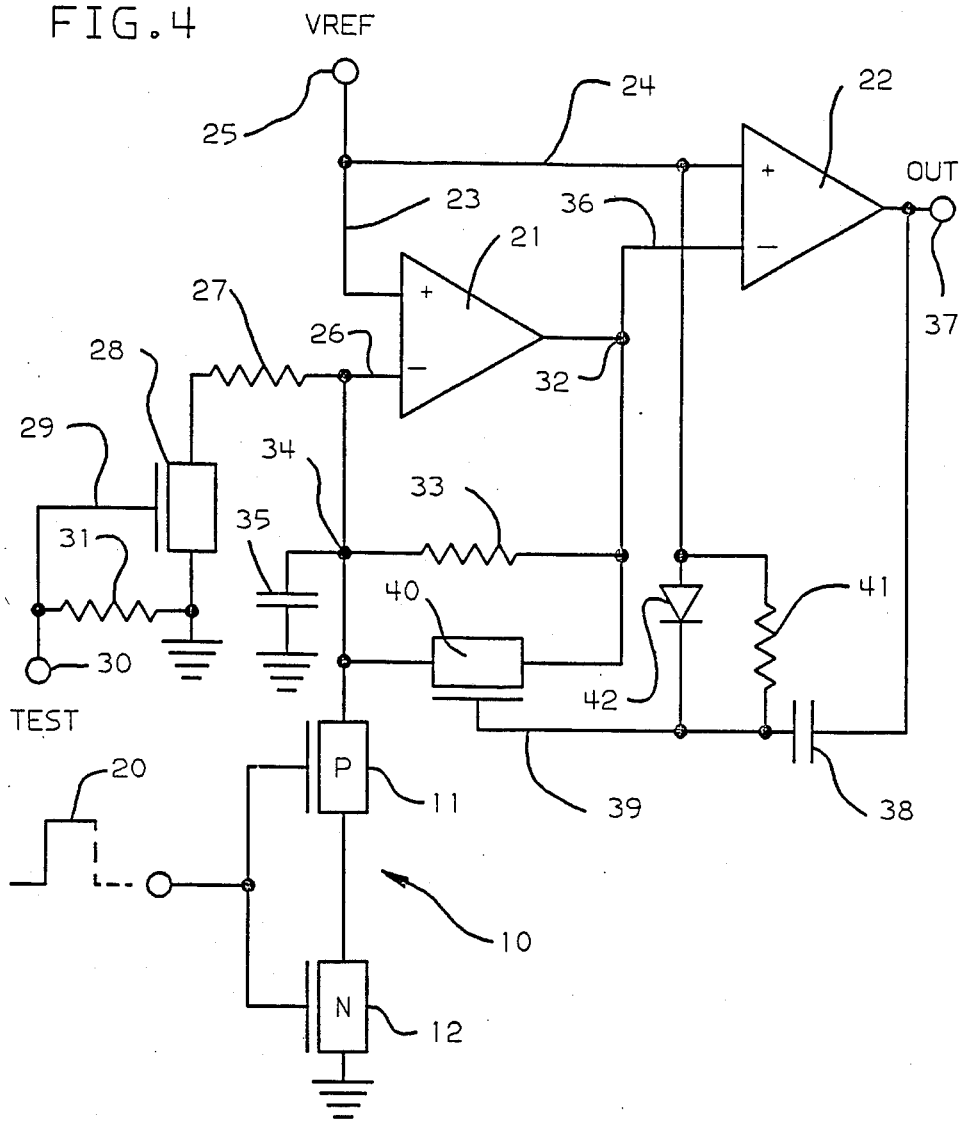
FIG. 4 illustrates in schematic form the improved current monitor circuit of the present invention which is especially useful for testing a CMOS circuit having a transistor with a shorted fault.

FIG. 1 illustrates a CMOS current monitor configuration of the prior art and basically is arranged to monitor the current flowing through a complementary switch 10 controlled by a common gate which is being tested. The CMOS switch being tested comprises a P transistor 11 serially connected to an "N" transistor 12 with both devices being in position between a power input 34 and ground and having their gates coupled to a common cyclic clock or other pulse source.

The monitor basically comprises a first differential amplifier 21 serially coupled to a second differential amplifier 22.

More specifically, both amplifiers 21 and 22 have their positive inputs 23 and 24 respectively coupled to an input voltage node 25. The negative input 26 of amplifier 21 is coupled to ground through a resistor 27 and a switching transistor 28. The switching transistor 28 has its control electrode 29 coupled to a test node 30 and to ground through a clamping resistor 31.

The output 32 of amplifier 21 is coupled through a first feedback loop to its own negative input 26, via a resistor 33, and to a node 34. To this node 34 the CMOS circuit 10 to be tested is also coupled together with a supply capacitor 35. This output 32 is also connected to the negative input 36 of amplifier 22. The output 37 of amplifier 22 is the output of the current monitor circuit of FIG. 1.

Normally, before a cyclical clock pulse or test pulse 20 is applied to the gates of the circuit 10 being tested, the P type transistor 11 or the N type transistor 12 is on but not both transistors and no current flows through the circuit as shown in FIG. 2 by line 14. However, during the clock pulse transitions, i. e., the rise or fall of the pulse, in this case let us assume the rise of pulse 20. Both transistors are in a momentary state of conduction and a voltage spike proportional to current 15 (FIG. 2) appears on the output 37 until one of the devices shuts off causing the spike to drop back to zero and a static state of no current as shown by line 16 in FIG. 2.

Again, as the pulse 20 falls another momentary spike 17 occurs and both devices turn on producing a transient current, after which no current flow occurs as shown by line 18 of FIG. 2. This repetitive pattern will continue as long as pulses are applied to the gates of the devices 11 and 12 and both devices 11 and 12 are operating in a correct fashion.

These transitions in the pulse 20 being applied to the gates of the transistors creates the undefined higher than normal current spikes 15 and 17 of FIG. 2 limited only by the internal resistance of the two field effect transistors 11 and 12. These spikes 15 and 17 generally last about 10 nanoseconds and yield very low average current in the order of 10 microamps.

In the case however where one of the devices, say the P type device 11 is in a shorted condition, a different effect is realized. If we assume, for example pulse 20 is going negative when applied to the gates, the N type device should be off and the P type device on and no current flow occurs as shown by line 14a of FIG. 3. Again, during the transition of the pulse the current rises as shown by 15a. At this time the positive state of the pulse 20 has been applied to the gates and the P type device should turn off causing the pulse 15a to drop to zero as shown by the dotted line in FIG. 2. However, in this case because of the shorted fault condition of the P type transistor 10, the current continues to flow as shown by the extended downside curve of pulse 15a. As shown in FIG. 2 the pulse width 15a is only slightly larger than the width of pulse 15 in FIG. 2 and thus it is difficult to determine that a shorted fault condition actually exists. Because the supply capacitor 35 coupled to the test node 34 has stored sufficient current change to the circuit under test, the output of the monitor registers only a slightly larger current spike 15a. Thus, the circuit as shown in FIG. 1 is inadequate to properly measure the shorted fault condition of the device under test.

The present condition was particularly designed to allow such a DC current test to be made without destabilizing the test circuit and to provide a significant output to assure that such a test indicated fully and completely that such a shorted fault condition occurred.

Moreover, the current monitor will provide high transient current and quickly switch to a low current measurement state after transient current clock time.

The current monitor of the present invention avoids this destabilization condition by employing therein a fast recovery power supply.

The circuit as shown in FIG. 4 basically comprises that shown in FIG. 1 and like numbers are used. The circuit includes both amplifiers 21 and 22 and their positive inputs 23 and 24 respectively coupled to an input voltage node 25. The negative input 26 of the amplifier 21 is coupled to ground through the switching transistor 28 and, via node 34, is coupled to the circuit under test and the supply capacitor 35. The switching transistor 28 has its control electrode 29 coupled to a test node 30 and to its drain and to ground through the clamping resistor 31.

The output 32 of amplifier 21 is coupled to the negative input 36 of amplifier 22 and through a first and negative feedback loop to its own negative input 26 via resistor 33. Again the output 37 of the amplifier 22 is the output of the monitor circuit.

The present invention however provides to the test monitor circuit an AC feedback loop, through a DC blocking capacitor 38 to the control electrode 39 of a shunting transistor 40, arranged to shunt resistor 33 in the first feedback loop of amplifier 21. This AC feedback loop from the output 37 of amplifier 22 is further connected to its own positive input 24 via a resistor 41 arranged in parallel with a diode 42.

Because, as noted above, a CMOS logic circuit is comprised of complementary transistors controlled by a voltage gate, both transistors are on for only short periods of time during the positive/negative pulse transition in the pulse signal being applied to the gates of the two devices simultaneously as discussed above in conjunction with FIG. 2. In the case however where one of these devices is shorted a DC current should exist for the duration of that portion of the applied clock pulse.

The improved test monitor circuit of FIG. 4 of the present invention allows such a shorted fault DC current measurement to be made during each cycle of the clock by comparing the measure-out against a reference limit without destabilizing the test monitor an operates as follows.

Figure 5:
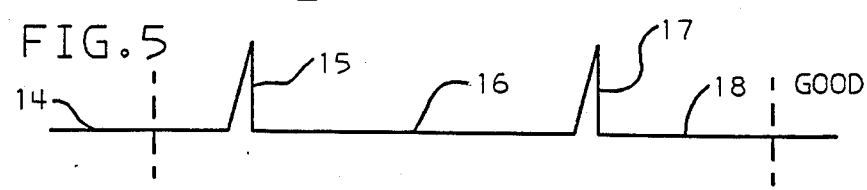
FIG. 5 illustrates the output of the current monitor circuit of FIG. 4, when a good CMOS circuit is tested.

If both devices 11 and 12 are good then during the transitions of pulse 20, spikes 15 and 17 occur above the base lines 14, 16 and 18 as shown in FIG. 5.

Now however, when one of the devices is shorted, again say the P device 11, a different result from that shown in FIG. 3 is realized.

In this case the output 32 of amplifier 21 drives the node 34 to which the transistor circuit under test is connected to approximately the voltage applied at the Vref voltage node 25.

Since amplifier 22 measures the differences between the voltage applied to the reference node 25 and the output of the amplifier 21, amplifier 22 saturates at approximately 11 volts during the AC cycle current time produced by the logic clock and as it saturates, causes the positive pulse transition of amplifier 22 whose output feeds through the DC blocking capacitor 38 to turn on transistor 40 that parallels and shunts the feedback resistor 33. This shunting of the feedback resistor 33 considerably lowers the effective feedback resistance provided by the feedback loop amplifier 21 and provides a significantly faster recharge power for the supply capacitor 35.

Figure 6:
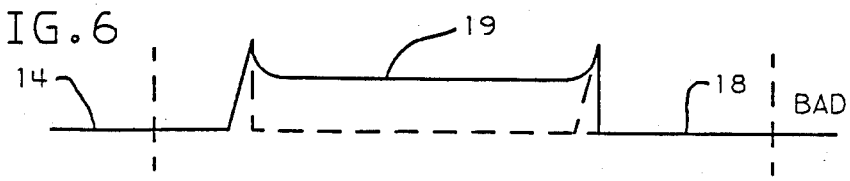
FIG. 6 illustrates the output of the current monitor circuit of FIG. 4 when one of the devices therein has a shorted fault.

Because capacitor 35 now recharges quickly the saturated condition of amplifier 22 is removed turning off transistor 40. Allowing amplifiers 21 and 22 to quickly measure the DC current after the AC transient. This measurement is shown in FIG. 6 as the level 19. Thus, the output 37 provides a measurable voltage amplitude indicating that a shorted fault condition exists in the CMOS circuit being tested. Diode 42, resistor 41, and capacitor 38 establish an AC time constant and clamp for the gate of shunt transistor 40.

In this way the circuit can cause to measure current levels of a shorted fault in CMOS devices.

It should be understood that various modifications can readily be made, for example the resistor and capacitive values could be held at different levels to better control the measured current and transient current performance.

Thus, while the invention has been particularly shown and described with reference to a preferred embodiment thereof it will be understood by those skilled in the art that the foregoing and other changes in form and detail may be made therein without departing from the spirit and scope of the invention.

What is claimed is:

1. A logic tester, a fast recovery power supply for supplying high current to a device under test and for measuring a low current of said device under test comprising:
   first and second amplifiers, each of said amplifiers having first and second inputs and each of said amplifiers having an output,
   the first amplifier coupled between a reference voltage and a device under test,
   the reference voltage being coupled to a first input of the first amplifier, the second amplifier being coupled between the reference voltage and the output of the first amplifier, capacitive means being coupled to the second input of the first amplifier and the device under test, resistive feedback means coupled between the second input and the output of the first amplifier and to the device under test, characterized by an AC coupled impedance switching means coupled to the output of the second amplifier and across the resistive feedback means for reducing the impedance of the resistive feedback means to recharge the capacitive means by switching on said impedance switching means to shunt the resistive feedback means.

2. The tester of claim 1 wherein said first and second amplifiers are differential current amplifiers each having positive and negative voltage inputs.

3. The tester of claim 1 wherein said impedance switching means comprising a transistor whose control electrode is coupled to the output of the second amplifier.

4. The tester of claim 3 wherein said control electrode is capacitively coupled to said output.

5. The tester of claim 4 wherein said control element is further coupled to the positive voltage input of the second amplifier via a resistor and a diode in parallel with said resistor.

* * * * *